(12) United States Patent
Lane

(10) Patent No.: US 10,861,679 B2
(45) Date of Patent: Dec. 8, 2020

(54) RESONANT STRUCTURE FOR A PLASMA PROCESSING SYSTEM

(71) Applicant: Tokyo Electron Limited, Tokyo (JP)

(72) Inventor: Barton Lane, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 718 days.

(21) Appl. No.: 14/838,839

(22) Filed: Aug. 28, 2015

(65) Prior Publication Data
US 2016/0071701 A1 Mar. 10, 2016

Related U.S. Application Data

(60) Provisional application No. 62/047,205, filed on Sep. 8, 2014.

(51) Int. Cl.
*H01J 37/32* (2006.01)

(52) U.S. Cl.
CPC .. *H01J 37/32623* (2013.01); *H01J 37/32082* (2013.01); *H01J 37/32091* (2013.01); *H01J 37/32146* (2013.01); *H01J 37/32174* (2013.01)

(58) Field of Classification Search
CPC .. H01J 2237/0656; H01J 37/321–3211; C23C 16/505; C23C 16/509; C23C 16/517; H05H 1/46; H05H 2001/4645; H05H 2001/4682
See application file for complete search history.

(56) References Cited

U.S. PATENT DOCUMENTS

| 6,414,648 B1* | 7/2002 | Holland | H01J 37/321 |
| | | | 118/723 I |
| 2004/0194890 A1* | 10/2004 | Moroz | H01J 37/32082 |
| | | | 156/345.48 |
| 2005/0034816 A1* | 2/2005 | Shannon | H01J 37/32082 |
| | | | 156/345.43 |
| 2005/0183668 A1* | 8/2005 | Lee | H01J 37/321 |
| | | | 118/723 I |
| 2009/0001890 A1* | 1/2009 | Singh | H01J 37/321 |
| | | | 315/111.21 |
| 2009/0176381 A1* | 7/2009 | Hiyama | G03F 7/427 |
| | | | 438/795 |
| 2011/0094997 A1* | 4/2011 | Yamazawa | H01J 37/321 |
| | | | 216/68 |

(Continued)

OTHER PUBLICATIONS

Definition of Insulate from Merriam-Webster Dictionary (Year: 2019).*

(Continued)

*Primary Examiner* — Rakesh K Dhingra
*Assistant Examiner* — Laureen Chan
(74) *Attorney, Agent, or Firm* — Wood Herron & Evans LLP

(57) ABSTRACT

A processing system is disclosed having a radio frequency (RF) power system coupled to a process chamber via a transmission line. The RF power system is configured to generate RF power at a RF operating frequency. The processing system also includes a resonant structure arranged within the plasma processing chamber that includes at least one resonant substructure configured to resonate according to at least two different resonant modes when at least one resonant frequency associated with at least one of the modes is at or near the RF operating frequency.

17 Claims, 7 Drawing Sheets

(56) References Cited

U.S. PATENT DOCUMENTS

| | | | | |
|---|---|---|---|---|
| 2011/0104902 A1* | 5/2011 | Yamazawa | ............ | H01J 37/321 |
| | | | | 438/710 |
| 2011/0308734 A1* | 12/2011 | Guittienne | ............ | H01J 37/321 |
| | | | | 156/345.33 |
| 2012/0132228 A1* | 5/2012 | Yanai | .................... | H01J 37/321 |
| | | | | 134/1.2 |
| 2012/0160806 A1* | 6/2012 | Godyak | ................ | H01J 37/321 |
| | | | | 216/61 |
| 2012/0270406 A1* | 10/2012 | Tahara | .................. | H01J 37/321 |
| | | | | 438/710 |
| 2013/0082030 A1* | 4/2013 | Zhao | .................. | H01J 7/32247 |
| | | | | 216/69 |

OTHER PUBLICATIONS

Definition of resonant from Merriam-Webster Dictionary (Year: 2019).*

* cited by examiner

RESONANT STRUCTURE FOR A PLASMA PROCESSING SYSTEM

CROSS REFERENCE TO RELATED APPLICATION

Pursuant to 37 C.F.R. § 1.78(a)(4), this application claims the benefit of an priority to prior filed Provisional Application Ser. No. 62/047,205, filed Sep. 8, 2014, which is expressly incorporated herein by reference.

FIELD OF THE INVENTION

This invention relates to semiconductor processing technology, and more particularly, to apparatus for controlling properties of a plasma processing system for treating a substrate.

BACKGROUND OF THE INVENTION

Typically, it is desirable to employ electromagnetic (EM) waves with frequencies in the radio frequency (RF) range (i.e., 3 kHz to 300 GHz) into a process chamber housing a substrate to heat electrons that generate plasma to treat a substrate. Within the RF range, EM waves may be employed with radio frequencies in ranges that include, for example, the high frequency (HF) range (i.e., 3 MHz to 30 MHz) and the very high frequency (VHF) range (i.e., 30 MHz to 300 MHz). Typically, the EM waves operate in RF frequency ranges with wavelengths that correspond to the size of the substrate and the size of the process chamber so that uniform electric fields are generated that in turn generate plasma to uniformly treat the substrate.

Large substrates, such as substrates that may be implemented in large microelectronic chips and/or solar panels for example, have relatively large physical dimensions (i.e., 300 mm to 450 mm in diameter) compared to other substrates of smaller physical dimensions (i.e., 100 mm to 200 mm in diameter). It is becoming common wisdom to use conventional EM waves that operate with radio frequencies in the VHF range to generate the plasma to process the large substrates rather than using lower radio frequencies typically used in treating smaller substrates, e.g., frequencies in the HF range. Conventional EM waves operating in the VHF range stimulate plasma in a manner so that the characteristics of the plasma are suitable for the treatment of large substrates. For example, the conventional VHF waves stimulate the plasma so that the plasma has a low ion bombardment energy and/or high plasma density when treating the large substrates.

The high frequencies of conventional VHF waves that generate plasma used to treat the large substrates result in conventional standing waves. The conventional standing waves generate a non-uniform electric field within the plasma. The non-uniformity of the electric field within the plasma alters the uniformity of the plasma so that different portions of the large substrate are treated with different plasma densities resulting in non-uniform treatment of the large substrate. For example, the plasma density of the plasma may be greater at the center of the large substrate as compared to the edges of the large substrate. Therefore, an effective means to implement RF waves to generate plasma that treats a substrate in a process chamber, particularly in the VHF range, that negates the effects of the non-uniform electric field within the plasma is needed.

SUMMARY OF THE INVENTION

In an embodiment, the present invention provides an apparatus for plasma processing of a substrate that includes a radio frequency (RF) power system that is coupled to a process chamber via a transmission line, and is configured to generate RF power at an RF operating frequency. The resonant structure includes at least one resonant substructure configured to resonate according to at least two different resonant modes when at least one resonant frequency associated with at least one of the resonant modes is at or near the RF operating frequency.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

Figure 1:
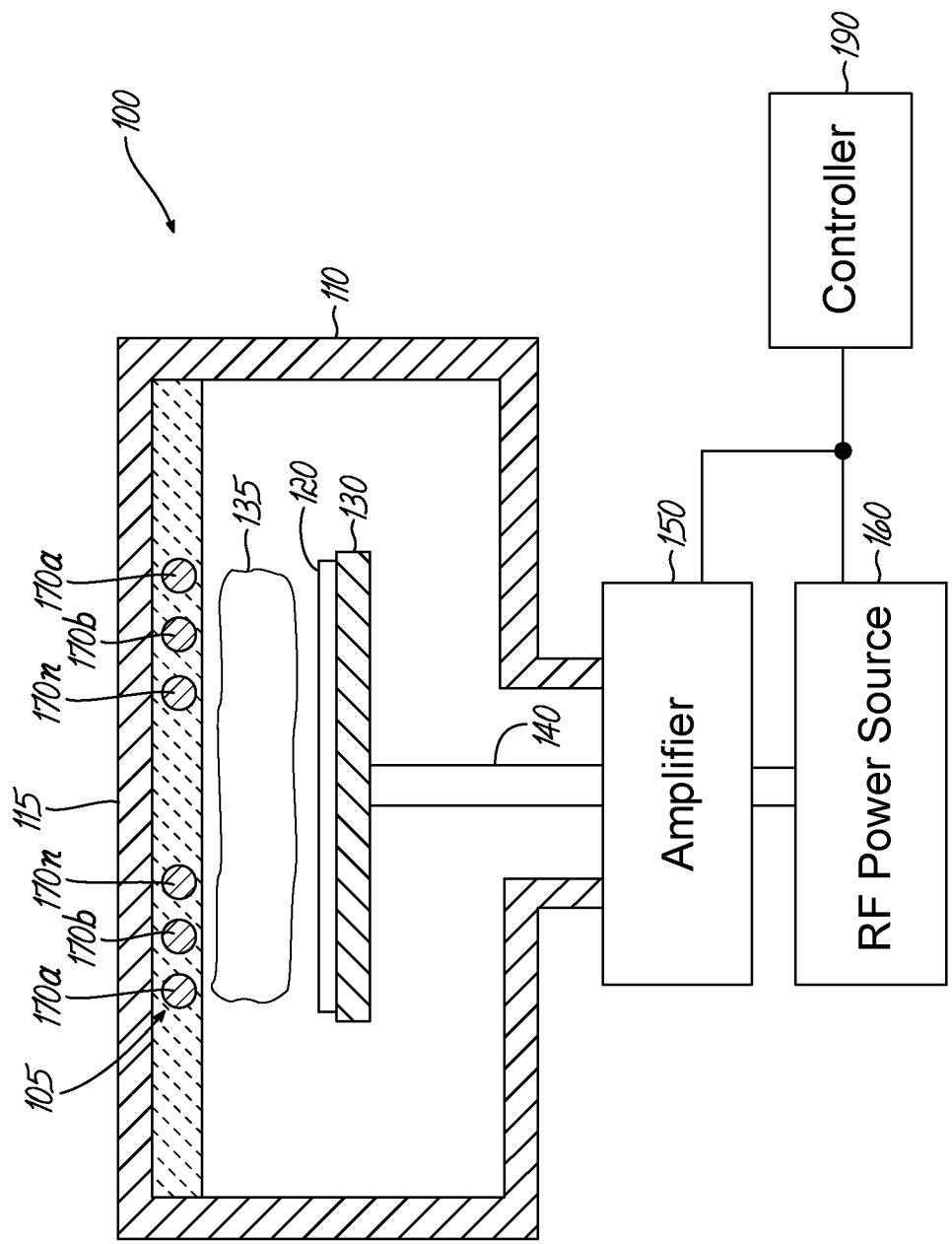
FIG. 1 is a diagrammatic cross-sectional view of a processing system for VHF wave treatment of a substrate in accordance with an embodiment of the invention.

The following Detailed Description refers to accompanying drawings to illustrate exemplary embodiments consistent with the present invention. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present invention. Therefore, the Detailed Description is not meant to limit the present invention. Rather, the scope of the present invention is defined only in accordance with the following claims and their equivalents.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present invention that others can, by applying knowledge of those skilled in the relevant art(s), readily modify and/or adapt for various applications such exemplary embodiments, without undue experimentation, without departing from the scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

The present invention controls the spatial pattern of an electric field generated by EM waves that radiate into the process chamber to heat electrons that then ignite plasma that treats the large substrate housed in the process chamber. For example, the ignited plasma may selectively etch and/or deposit material onto the large substrate to treat the large substrate. The EM waves operate in the radio frequency (RF) range (i.e., 3 kHz to 300 GHz), particularly the EM waves operate in the very high frequency (VHF) range (i.e., 30 MHz to 300 MHz). The control of the spatial pattern of the electric field generated by the EM waves may be done by adding a resonant structure that includes resonant substructures to the process chamber where the resonant substructures are constructed with a particular size and shape so that the resonant substructures are at or near resonance with the electric field generated by the EM waves. For example, the resonant substructures may have physical lengths which are comparable to half or quarter wavelengths of the electric field.

FIG. 1 is a diagrammatic cross-sectional view of a processing system 100 for plasma processing of a substrate 120. A resonant structure 105 may be coupled to or adjacent to a planar top surface 115 of a process chamber 110 so that the resonant structure 105 may be positioned opposite the substrate 120. The resonant structure 105 may include one or more resonant substructures 170(a-n), where a is equal to one and n is an integer equal to or greater than one, that are positioned so that a portion of the surface of the substrate 120 may be encompassed by the resonant structure 105 from above the surface of the substrate 120. Resonant substructures 170(a-n) may be spiral-shaped conductive structures and/or any other structures that resonate at a resonate frequency when engaging a RF wave, particularly a VHF wave, at an RF operating frequency that is at or near to a resonant frequency that will be apparent to those skilled in the relevant art(s) without departing from the scope of the present invention.

In the description that follows, RF power is coupled from an RF power source 160 along a transmission line 140 into the process chamber 110 such that the process chamber 110 and the transmission line 140 form a closed, continuous surface to prevent RF waves from radiating into the process chamber 110. The process chamber 110 may be partially evacuated by a vacuum pump (not shown) and gases may be introduced by a gas metering system (not shown) to generate a prescribed gas mixture at a prescribed pressure in the process chamber 110. The combination of RF power, gas mixture and gas pressure enable the electric field introduced into the process chamber 110 to heat electrons to generate plasma 135 in the process chamber 110. Plasma 135 activates the gas mixture in order to produce an active neural species. The substrate 120 may be exposed to the combination of the active neural species and heated electrons included in plasma 135 so that selective etching and/or deposition of materials may be performed on the substrate 120.

The closed cavity of the process chamber 110 enables the spatial profile of the RF electric fields to be determined by Maxwell's equations relative to the plasma 135. A factor in Maxwell's equations is the radial dependence the plasma 135 which depends on the geometry of the process chamber 110 and the wavelength of the EM waves. EM waves launched at the radial edge of the plasma 135 concentrate as the EM waves move toward the center of the substrate 120 which leads to a peaking of the electric field in the center of the substrate and to a subsequent increase in the plasma density of the plasma 135 at the center of the substrate 120. The increase in the plasma density of the plasma 135 at the center of the substrate 120 increases as the frequency of the EM waves is increased eventually leading to a low plasma density of the plasma at the edges of the substrate 120 and a high plasma density at the center of the substrate 120.

The uniformity of the plasma density may be improved with the resonant structure 105. The resonant structure 105 may be isolated from the RF power source 160 so that the resonant structure 105 is not directly excited by RF power generated by the RF power source 160 differentiating the resonant structure 105 from an antenna. Rather, the EM energy is fed into the process chamber from the transmission line 140 that is isolated from and in a different location than the resonant structure 105.

In another embodiment, the process chamber 110 houses the substrate 120 so that the substrate 120 may undergo substantially uniform processing from the plasma 135 ignited by the RF power generated by the RF power source 160. As noted above, portions of the substrate 120 may be exposed to lower plasma density than other portions of the substrate 120 due to a non-uniform electric field within the plasma 135 that results from the standing waves present in the process chamber 110. The resonant structure 105 may include resonant substructures 170(a-n). The resonant substructures 170(a-n) may be coupled to an interior of process chamber 110. The resonant substructures 170(a-n) may also be suspended by a dielectric so that the resonant substructures 170(a-n) may be electrically floating. As noted above, the resonant substructures 170(a-n) are not directly connected to the transmission line 140 so the resonant substructures 170(a-n) are not powered antennas.

In an embodiment, the resonant structure 105 may include a material 106, such as quartz, that is electrically floating with a high RF impedance to ground so that the material forms an insulating plate-shaped member that encompasses the resonant substructures 170(a-n) forming the resonant structure 105. In another embodiment, the resonant substructures 170(a-n) may each individually be an electrically floating rod that are positioned with gaps between each other so that the resonant structure 105 includes the formulation of the resonant substructures 170(a-n). In either embodiment, the resonant structure 105 may be coupled at or adjacent to the planar top surface 115 of the process chamber 110. The planar top surface 115 along with the walls of the process chamber 110 may be grounded while the resonant structure 105 may electrically float relative to the grounded planar top surface 115. The resonant substructures 170(a-n) may be mounted inside a quartz or ceramic structure so that the resonant substructures 170(a-n) are not directly embedded in the plasma 135.

At least one resonant substructure 170(a-n) may be positioned over a portion of the substrate 120 that is exposed to a lower plasma density than other portions of the substrate 120 due to the non-uniform electric field included in the plasma 135. The dimensions of the resonant substructures 170(a-n) of the resonant structure 105 may be selected so that the resonant substructures 170(a-n) resonate at a resonant frequency. The resonant frequency may be selected so that the resonant frequency is at or near to the RF operating frequency and/or one or more integer multiples, referred to as harmonics of the RF operating frequency, for the RF waves emitted by the transmission line 140. The resonant substructures 170(a-n) may resonate at the resonant frequency when the resonant substructures 170(a-n) engage a RF wave at an RF operating frequency and/or any of the harmonics of the RF operating frequency that are at or near the resonant frequency (e.g., ±10% from the resonant frequency). For example, the transmission line 140 emits RF waves at an RF operating frequency of 60 MHz. The dimensions of the resonant substructures 170(a-n) may be selected so that the resonant substructures 170(a-n) resonate at a resonant frequency of 60 MHz and also resonate at each of the harmonics for the 60 MHz operating frequency. The length scale of the resonant substructures 170(a-n) which are suspended freely may be a ½ wavelength of resonant frequency for a wavelength in the dielectric material in which the resonant substructures 170(a-n) are embedded. For example, the resonant substructures 170(a-n) may be embedded in quartz or a vacuum.

The resonant substructures 170(a-n) of the resonant structure 105 may resonate over the portion of the substrate 120 that is exposed to the lower plasma density and modify the weakened electric fields. The resonating of the resonant substructures 170(a-n) at the resonant frequency may increase the weakened electric fields located between the resonant structure 105 and the substrate 120. Increasing the weakened electric fields increases the plasma density to which that portion of the substrate 120 is now exposed. The plasma density may be increased to a level that is similar to the plasma density levels that other portions of the substrate 120 are receiving. Thus, the uniformity in the plasma 135 that treats the substrate 120 may be increased based on the entire substrate 120 being exposed to similar plasma densities.

For example, standing waves generate a non-uniform electric field within the plasma 135. The non-uniform electric field within the plasma 135 results in non-uniform plasma density that treats the substrate 120. As a result, the plasma density is higher at the center of the substrate 120 as compared to the edges of the substrate 120 resulting in an uneven distribution of the plasma density across the substrate 120.

The resonant substructures 170(a-n) have dimensions that enable the resonant substructures 170(a-n) to resonate at a resonant frequency of 60 MHz and also at each of the harmonics of 60 MHz. The resonant substructures 170(a-n) are also positioned over the edge portions of the substrate 120 that is exposed to the low plasma density as compared to the higher plasma densities seen at the center of the substrate 120. The resonant substructures 170(a-n) resonate as the resonant substructures 170(a-n) engage the RF waves with RF operating frequencies of 60 MHz. The resonating of the resonant substructures 170(a-n) increases the amount of energy transferred by the non-uniform electric field onto the edge portions of the substrate 120 thus increasing the plasma density received by the edge portions of the substrate 120. The increase in the plasma density received by the edge portions of the substrate 120 is similar to the plasma densities seen at the center of the substrate 120 that were exposed to higher plasma densities resulting in an increase in the uniformity in the plasma 135 that treats the substrate 120.

In an embodiment, the portions of the substrate 120 that are exposed to lower plasma densities as compared to other portions of the substrate 120 that are exposed to higher plasma densities may be determined based on pre-determined process conditions. The uniformity of the plasma 135 that treats the substrate 120 may be analyzed by processing the substrate 120 in the process chamber 110 with the RF waves at a designated RF operating frequency without the resonant structure 105 included in the process chamber 110, and thereafter analyzing the processed substrate 120. The resonant substructures 170(a-n) may then be sized to resonate at the designated RF operating frequency as the substrate 120 is processed by the plasma 135. The resonant substructures 170(a-n) may also be positioned in the process chamber 110 so the resonant substructures 170(a-n) are over the portions of the substrate 120 that have been exposed to the lower plasma densities.

The pre-determined process conditions may also disclose that multiple portions of the substrate 120 require an increase in the plasma density to maintain the uniformity of the plasma 135 that treats the substrate 120. However, different portions of the substrate 120 may require different increases in the plasma density relative to other portions of the substrate 120 to maintain the plasma uniformity. For example, the plasma density at the center portion of the substrate 120 may be higher than the plasma density at the edge portions of the substrate 120. However, the plasma density at the center portion of the substrate 120 may be an insufficient level to adequately treat the substrate 120 and requires an increase in plasma density but not as much of an increase as required at the edge portions of the substrate 120. Uniformly increasing the plasma density of both the center portion and the edge portions of the substrate 120 may still result in a non-uniform plasma distribution of the plasma 135 on the substrate 120. Positioning the resonant substructures 170(*a-n*) over the substrate 120 so that each resonant substructure 170(*a-n*) resonates at substantially similar resonant frequencies with substantially similar energy levels may not provide a uniform distribution of the plasma 135 when different portions of the substrate 120 require different increases in the plasma density.

Rather, the resonant substructures 170(*a-n*) may be sized so that each resonant substructure 170(*a-n*) resonates with a different energy level. The differentiating energy levels generated by each resonating resonant substructure 170(*a-n*) may have a different increase in the plasma density for the corresponding portions of the substrate 120. For example, the edge portions of the substrate 120 may require a larger increase in plasma density than the center portion of the substrate 120. Thus, the resonant substructure 170*a* that corresponds to the edge portions of the substrate 120 may be sized so the resonant substructure 170*a* resonates with a greater energy level than the resonant substructure 170*n* that corresponds to the center portion of the substrate 120.

In an embodiment, the resonant substructures 170(*a-n*) may resonate at multiple different resonant frequencies and/or with multiple different energy levels so that different portions of the substrate 120 may receive different increases in plasma density. As noted in the examples above, the plasma density of the plasma 135 higher at the center portion of the substrate 120 as compared to the edge portions of the substrate 120 due to a non-uniformity in the electric field generated by the standing waves. However, the non-uniformity in the electric field may also result in plasma density that is higher at the edge portions of the substrate 120 as compared to the center portions of the substrate 120. Further, the non-uniformity in the electric field may also result in both the center portions and the edge portions of the substrate 120 both requiring increases in plasma density but in different magnitudes to obtain plasma uniformity for the substrate 120. Thus, the resonant substructures 170(*a-n*) may be positioned over the substrate 120 so that different portions of the resonant substructures 170(*a-n*) may resonate over corresponding portions of the substrate 120 at different resonant frequencies and/or with different energy levels.

The resonant substructures 170(*a-n*) may include any number of structures greater than or equal to one that may be necessary to adequately obtain plasma uniformity for the substrate 120 that will be apparent to those skilled in the relevant art(s) without departing from the scope of the present invention. The resonant substructures 170(*a-n*) may also include any type of geometry such as length, diameter, and so on that may be necessary to for the resonant substructures 170(*a-n*) to resonate with resonant properties such as at a specific energy level and at or near a specific resonant frequency to adequately obtain plasma uniformity for the substrate 120 that will be apparent to those skilled in the relevant art(s) without departing from the scope of the present invention. The resonant substructures 170(*a-n*) may resonate when an RF operating frequency is within ±10% of the resonant frequencies for each of the resonant substructures 170(*a-n*) and/or within any other threshold of the resonant frequencies that will trigger the resonant substructures 170(*a-n*) to resonate that will be apparent to those skilled in the relevant art(s) without departing from the scope of the present invention.

For ease in discussion, the resonant substructures 170(*a-n*) will be limited to resonant substructures 170*a*, 170*b*, and 170*n* as shown in FIGS. 1, 2A, 2B, and 3. However, as noted above, the resonant substructures 170(*a-n*) may include any number of resonant substructures. Further, for ease in discussion, a specific resonant substructure, such as resonant substructure 170*a* for example, may be selected as an example in discussing embodiments of the invention. However, any of the resonant substructures 170(*a-n*) may also exercise similar characteristics regarding a discussed resonant substructure and may be substituted with the resonant substructure specifically cited in examples. Thus, the invention is not limited to the discussed resonant substructure cited examples. Rather any of the resonant substructures 170(*a-n*) can be used in a similar fashion as the discussed resonant substructure cited in examples.

The resonant substructures 170(*a-n*) included in the resonant structure 105 may be sized differently so that each resonant substructure 170(*a-n*) resonates at different resonant frequencies with different energy levels. For example, the resonant substructure 170*a* may be sized with dimensions that differ from the dimensions of the resonant substructure 170*n* so that the resonant substructure 170*a* resonates at a first resonant frequency with a first energy level and the resonant substructure 170*n* resonates at a second resonant frequency at a second energy level. The resonant substructure 170*a* may be positioned over the substrate 120 to encompass a first portion of the substrate 120. The resonant substructure 170*n* may be positioned over the substrate 120 to encompass a second portion of the substrate 120 that is different from the first portion. The resonant substructure 170*a* then resonates at a first energy level when the resonant substructure 170*a* engages RF waves that propagate at an RF operating frequency and/or harmonics of the RF operating frequency that are at or near the first resonant frequency increasing the plasma density of the first portion of the substrate 120. The resonant substructure 170*n* then resonates at a second energy level when the resonant substructure 170*n* engages RF waves that propagate at an RF operating frequency and/or harmonics of the RF operating frequency that are at or near to the second resonant frequency increasing the plasma density of the second portion of the substrate 120.

A controller 190 may control the RF power source 160 so that the RF power source 160 may adjust the RF power that is provided to the transmission line 140 so that the transmission line 140 transmits RF waves into the process chamber 110 that propagate at the desired RF operating frequency. The controller 190 may control the RF power source 160 so that the RF power source 160 adjusts the RF power to a first power level. The RF power source 160 provides the RF power at the first power level so that the transmission line 140 ignites plasma 135 with RF waves into the process chamber 110. The RF waves generated from the first power level propagate at an RF operating frequency that is at or near the first resonant frequency of the resonant substructure 170*a* causing the resonant substructure 170*a* to resonate at the first energy level. The resonation of the resonant substructure 170*a* increases the plasma density of the first portion of the substrate 120. The controller 190 may also control the RF power source 160 to adjust the RF power to a second power level that generates RF waves that propagate at an RF operating frequency that is at or near the second resonant frequency to increase the plasma density of the second portion of the substrate 120.

As noted above, the portions of the substrate 120 that require an increase in plasma density so that the substrate 120 is uniformly treated with plasma 135 may be based on pre-determined process conditions. The controller 190 may control the RF power source 160 based on the pre-determined process conditions. For example, the pre-determined process conditions indicate that the edge portions of the substrate 120 require an increase in plasma density relative to the center portion of the substrate 120. The controller 190 controls the RF power source 160 to adjust the RF power to the first power level so that the RF waves are generated that propagate at the first resonant frequency causing the resonant substructure 170a to resonate and thus increasing the plasma density that the edge portions of the substrate 120 is exposed.

The controller 190 may transition the RF power source 160 between the first power level and the second power level so that the each portion of the substrate 120 may receive an appropriate increase in plasma density during the processing of the substrate 120. Exposing each portion of the substrate 120 to an appropriate increase in plasma density may increase the likelihood that each portion of the substrate 120 is uniformly treated with the plasma 135. A time interval that each portion of the substrate 120 receives the increase in the plasma density may be determined based on pre-determined process conditions. For example, a first time interval may be determined to expose the edge portions of the substrate 120 to the increased plasma density and a second time interval may be determined to expose the center portion of the substrate 120 to the increased plasma density based on the pre-determined process conditions. The first time interval and the second time interval may be determined from the pre-determined process conditions so that the uniformity of the plasma 135 that treats the substrate 120 is at an optimal level.

For example, the controller 190 may first control the RF power source 160 to generate RF power at the first power level for the first time interval. During the first time interval, the RF power at the first power level ignites the plasma 135 in the process chamber 110 with RF waves that propagate at an RF operating frequency that is at or near the first resonant frequency causing the resonant substructure 170a to resonate at the first energy level resulting in an increase of plasma density received by the edge portions of the substrate 120. After the first time interval has been completed, the controller 190 transitions the RF power source 160 from generating RF power at the first power level to generating RF power at the second power level for the second time interval. During the second time interval, the RF power at the second power level ignites the plasma 135 in the process chamber 110 with RF waves that propagate at an RF operating frequency that is at or near the second resonant frequency causing the resonant substructure 170n to resonate at the second energy level resulting in an increase of plasma density received by the center portion of the substrate 120. The controller 190 may then transition the RF power source 160 back and forth from the first power level to the second power level until the substrate 120 is processed.

In an embodiment, the resonant substructures 170a and 170n may resonate simultaneously at the different energy levels when the resonant substructures 170a and 170n engage RF waves at an RF operating frequency that is between the first resonant frequency of the resonant substructure 170a and the second resonant frequency of the resonant substructure 170n. Each portion of the substrate 120 may then receive the appropriate increase in the plasma density simultaneously when the resonant substructures 170a and 170n resonate simultaneously at the different energy levels.

The controller 190 may control the RF power source 160 so that the RF power source 160 generates RF power at a selected power level. The RF power generated at the selected power level may ignite the plasma 135 in the process chamber 110 with RF waves that propagate at a selected RF operating frequency. The selected RF operating frequency may be within a threshold of the first resonant frequency associated with the resonant substructure 170a so that the first resonant frequency is at or below (e.g., −10%) the selected RF operating frequency. The selected RF operating frequency may also be within a threshold of the second resonant frequency associated with the resonant substructure 170n so that the second resonant frequency is at or above (e.g., +10%) the selected RF operating frequency. Thus, the selected RF operating frequency is between the first and second resonant frequencies.

The resonant substructures 170(a-n) may simultaneously resonate at the first and second energy levels, respectively, when the resonant substructures 170a and 170n engage the RF waves at the selected RF operating frequency. The simultaneous resonation of the resonant substructures 170a and 170n at the different energy levels may then trigger simultaneous increases of the plasma density to the appropriate level for the center portion of the substrate 120 and of the plasma density to the appropriate level for the edge portions of the substrate 120.

In an embodiment, the selected RF operating frequency may be obtained by mixing signals that propagate at the first resonant frequency and the second resonant frequency to generate a mixed signal that propagates at the selected RF operating frequency. The mixed signal operating at the selected RF operating frequency may then simultaneously trigger the resonation of the resonant substructures 170a and 170n.

The controller 190 may control the power of the RF power source 160 to generate RF power that includes two signal components. The first signal component may propagate at a first RF operating frequency that is at or near the first resonant frequency and a second signal component may propagate at a second RF operating frequency that is at or near the second resonant frequency. The controller 190 may then control an amplifier 150 to adjust the amplitude of the first signal component operating at the first RF operating frequency and the amplitude of the second signal component operating at the second RF operating frequency. The amplitudes of the first and second signal components may be adjusted so that the first and second signal components may be appropriately mixed to generate a combined signal that propagates at the selected RF operating frequency that is between the first resonant frequency and the second resonant frequency. The combined signal operating at the selected RF operating frequency may then simultaneously trigger the resonation of the resonant substructures 170a and 170n.

The relationship between the combined signal operating at the selected RF operating frequency, first and second signal components, and the amplitudes of the first and signal components can be seen in Equations 1 and 2 below, $$F = a*F_1 + b*F_2, \quad (1)$$

where, $$F_1 \leq F \leq F_2. \quad (2)$$

The controller 190 may control the amplifier 150 so that the combined signal (F) generated by the RF power source 160 propagates at the selected RF operating frequency. The controller 190 may control the amplifier 150 to adjust the amplitude (a) of the first signal component ($F_1$) that is operating at the first RF operating frequency. The controller 190 may also control the amplifier 150 to adjust the amplitude (b) of the second signal component ($F_2$) that is operating at the second RF operating frequency. The amplitudes (a) and (b) may be adjusted until the first signal component ($F_1$) and the second signal component ($F_2$) are properly mixed to generate the combined signal (F) that propagates at the selected RF operating frequency.

In an alternative embodiment, the amplifier 150 may be replaced by a second RF power source (not shown). In such an embodiment, the controller 190 may control the RF power source 160 to generate the first signal component ($F_1$) at the first RF operating frequency. The controller 190 may also control the second RF power source to generate the second signal component ($F_2$) at the second RF operating frequency. The controller 190 may adjust the amplitudes (a) and (b) of the first signal component ($F_1$) and the second signal component ($F_2$), respectively, by directly adjusting the RF power source 160 and the second RF power source. A coupler (not shown) may then mix the first signal component ($F_1$) and the second signal component ($F_2$) to generate the combined signal (F) that propagates at the selected RF operating frequency.

Figure 2A:
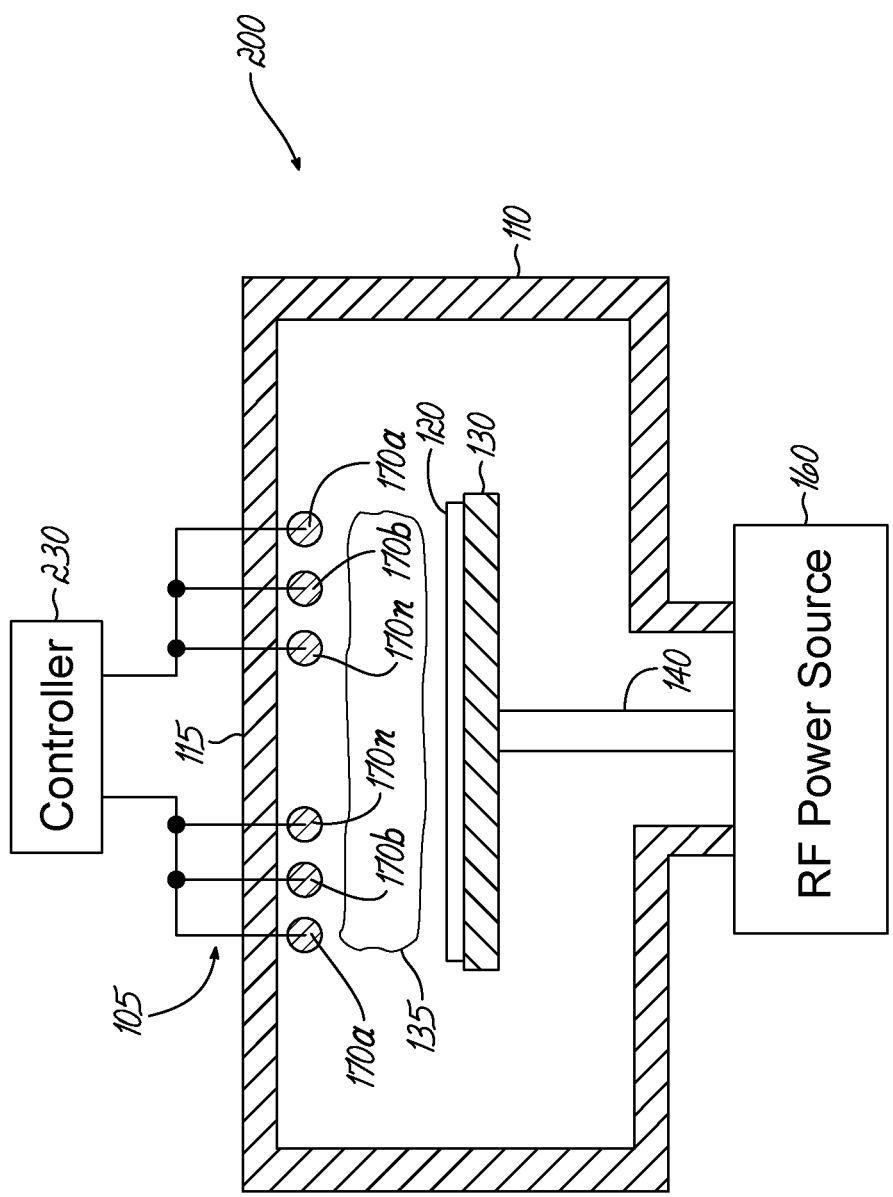
FIG. 2A is a diagrammatic cross-sectional view of a processing system for VHF wave treatment of a substrate that depicts the positioning of resonant structures in accordance with an embodiment of the invention.
Figure 2B:
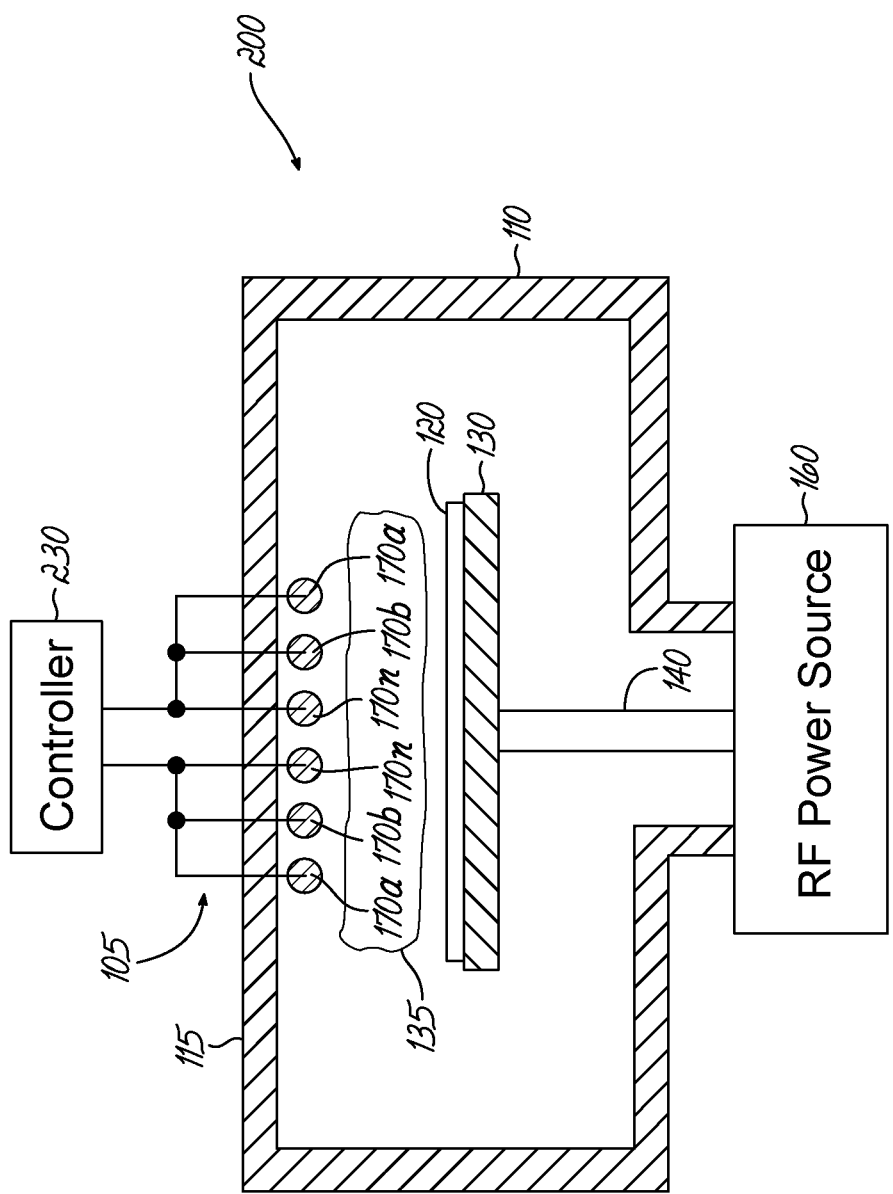
FIG. 2B is another diagrammatic cross-sectional view of a processing system for VHF wave treatment of a substrate that depicts the positioning of resonant structures in accordance with an embodiment of the invention.

Referring to FIGS. 2A and 2B, in which like references numerals are used to refer to like parts, a diagrammatic cross-sectional view of processing system 200 for RF wave treatment of a substrate is shown. The processing system 200 shares many similar features with the processing system 100; therefore, only the differences between the processing system 200 and the processing system 100 are to be discussed in further detail. The resonant frequency of the resonant substructures 170(a-n) depends on the geometry of the resonant substructures 170(a-n) and also the position of the resonant substructures 170(a-n) relative other structures and features. Thus, the resonant frequency of the resonant substructures 170(a-n) may be changed by mechanically moving the resonant substructures 170(a-n) or a portion of the resonant substructures 170(a-n). Rather than adjusting the frequency of the RF power generated by the RF power source 160 to adjust the plasma density relative to different portions of the substrate 120, the system is modified to adjust the positioning of the resonant substructures 170(a-n) to adjust the plasma density relative to different portions of the substrate 120. For example, as shown in FIGS. 2A and 2B, the controller 230 adjusts the positioning of the resonant substructures 170(a-n).

In an embodiment, resonant substructures 170(a-n) may be sized and/or positioned relative to each other to generate energy during resonation at specified energy levels. The resonant frequencies for each resonant substructure 170(a-n) may differ and also the energy levels generated by each resonant substructure 170(a-n) may also differ. Rather than adjusting the RF operating frequency to excite each resonant substructure 170(a-n) into resonation, the RF operating frequency may remain fixed triggering resonation of a single conductive structure, such as resonant substructure 170a for example, where the resonant substructure 170a resonates with an energy level associated with the properties of the resonant substructure 170a. The position of the resonating resonant substructure 170a may then be adjusted so that different portions of the substrate 120 may receive an increase in plasma density from the resonating resonant substructure 170a.

The resonant substructures 170(a-n) may be sized and/or positioned relative to each other based on pre-determined process conditions. For example, the resonant substructure 170a may be sized to resonate at a first resonant frequency with a first energy level and the resonant substructure 170n may be sized to resonate at a second resonant frequency with a second energy level. The resonant substructures 170(a-n) may also be sized so that the spatial distribution of the energy emitted by the resonant substructures 170(a-n) during resonation onto the substrate 120 covers a specified surface area of the substrate 120. For example, the resonant substructure 170a may be sized so that the spatial distribution of the energy emitted by the resonant substructure 170a during resonation covers a larger surface of the substrate 120 than the spatial distribution of the energy emitted by the resonant substructure 170n during resonation. In an embodiment, the resonant substructures 170(a-n) may be spiral-shaped conductive rods. Each outer radial end of each resonant substructure 170(a-n) may be spaced at azimuthal intervals substantially equal to $2\pi$ radians divided by the quantity of conductive structures (n).

The pre-determined process conditions may designate that a portion of the substrate 120 may require an increase in plasma density at an energy level that is provided by a specific resonant substructure 170n so that the substrate 120 may be uniformly treated with plasma 135. For example, the pre-determined process conditions may determine that an increase in plasma density to the center portion of the substrate 120 at a specified energy level relative to the edge portions of the substrate 120 may provide the substrate 120 with uniform treatment by the plasma 135. As a result, the pre-determined process conditions may designate that the center portion of the substrate 120 receives an increase in plasma density that is provided at an energy level that is associated with the resonant substructure 170n, as an example, so that the substrate 120 may be uniformly treated by the plasma 135.

The resonant substructure 170n selected to generate energy during resonation to increase the plasma density for a specified portion of the substrate 120 may not be positioned above the corresponding portion of the substrate 120 in need of the increase in plasma density. Thus, the controller 230 may control the position of the resonant structure 105 so that the selected resonant substructure 170n may be positioned above the appropriate portion of the substrate 120 that requires an increase in plasma density.

For example, as shown in FIG. 2A, the resonant substructure 170n is selected to resonate at its specified energy level to increase the plasma density of the center portion of the substrate 120. However, the resonant substructure 170n is currently positioned above outer portions of the substrate 120 that are not in need of an increase in plasma density. As shown in FIG. 2B, the controller 230 may control the position of the resonant structure 105 so that the selected resonant substructure 170n is positioned over the center portion of the substrate 120 that requires the increase in plasma density.

The resonant substructure 170n selected to generate energy during resonation to increase the plasma density for a specified portion of the substrate 120 resonates at a known resonant frequency. In order to trigger the selected resonant substructure 170n to resonate, the RF power source 160 generates RF power at a power level ignites the plasma 135 so that an RF operating frequency is at or near the resonant frequency of the selected resonant substructure 170n. The selected resonant substructure 170n may then resonate at its specified energy level increasing the plasma density of the specified portion of the substrate 120 in need of an increase in plasma density at the energy level provided by the selected resonant substructure 170n. The remaining resonant substructures 170b and 170a may have resonant frequencies that are substantially different from the operating frequencies of the EM waves and thus do not resonate while the resonant substructure 170n resonates and have substantially no impact on the plasma density of the plasma 135.

As noted above, a time interval that each portion of the substrate is exposed to an increase in plasma density may be determined based on pre-determined process conditions. The controller 230 may control the position of the resonant structure 105 so that the selected resonant substructure 170n resonates over a first portion of the substrate 120 for a first time interval. After the first time interval has been completed, the controller 230 may then transition the position of the resonant substructure 170n so that the selected resonant substructure 170n resonates over a second portion of the substrate 120 for a second time interval. The controller 230 may then transition the position of the selected resonant substructure 170n back and forth between corresponding positions on the substrate 120 until the substrate 120 is processed.

As noted above, the resonant substructures 170a and 170n may resonate simultaneously at the different energy levels when the resonant substructures 170a and 170n engage RF waves at an RF operating frequency that is between the first resonant frequency of the resonant substructure 170a and the second resonant frequency of the resonant substructure 170n. Each portion of the substrate 120 may then receive the appropriate increase in the plasma density simultaneously when the resonant substructures 170a and 170n resonate simultaneously at the different energy levels.

Applying this concept to the embodiment disclosed in FIGS. 2A and 2B, an RF operating frequency may be selected that is between the first resonant frequency and the second resonant frequency and sufficient to trigger both resonant substructures 170a and 170n into resonance simultaneously. The RF power source 160 may generate RF power at a power level that ignites the plasma 135 with the selected RF operating frequency to trigger the resonant substructures 170a and 170n into resonance simultaneously. Based on the pre-determined process conditions, the controller 230 may then transition the positions of the resonant substructures 170a and 170n after the completion of each time interval. Thus, different portions of the substrate 120 may receive the simultaneous increases in the plasma density at the energy levels that correspond to the resonant substructures 170a and 170n. The remaining resonant substructure 170b may have a resonant frequency that is substantially different from the RF operating frequency and thus does not resonate while the resonant substructures 170a and 170n resonate and has substantially no impact on the plasma density of the plasma 135.

In an embodiment, the position of the substrate holder 130 may be transitioned by the controller 230 rather than the resonant structure 105. The controller 230 may transition the substrate holder 130 in a similar manner as discussed above in regards to how the controller 230 transitions the position of the resonant structure 105 so that each appropriate portion of the substrate 120 receives the appropriate increase in plasma density from the selected resonant substructure 170 (a-n). The difference being that the controller 230 transitions the substrate holder 130 while maintaining the position of the resonant structure 105.

In an embodiment, a vertical distance between the selected resonant substructures 170(a-n) and the substrate 120 may be adjusted by the controller 230. The controller 230 may lower the selected resonant substructures 170(a-n) that are resonating to be closer to the substrate 120. The lowering of the resonating resonant substructures 170(a-n) to be closer to the substrate 120 may increase the energy level received from the portion of the substrate 120 that is below the resonating resonant substructures 170(a-n) thereby increasing the plasma density received by the portion of the substrate 120.

Figure 3:
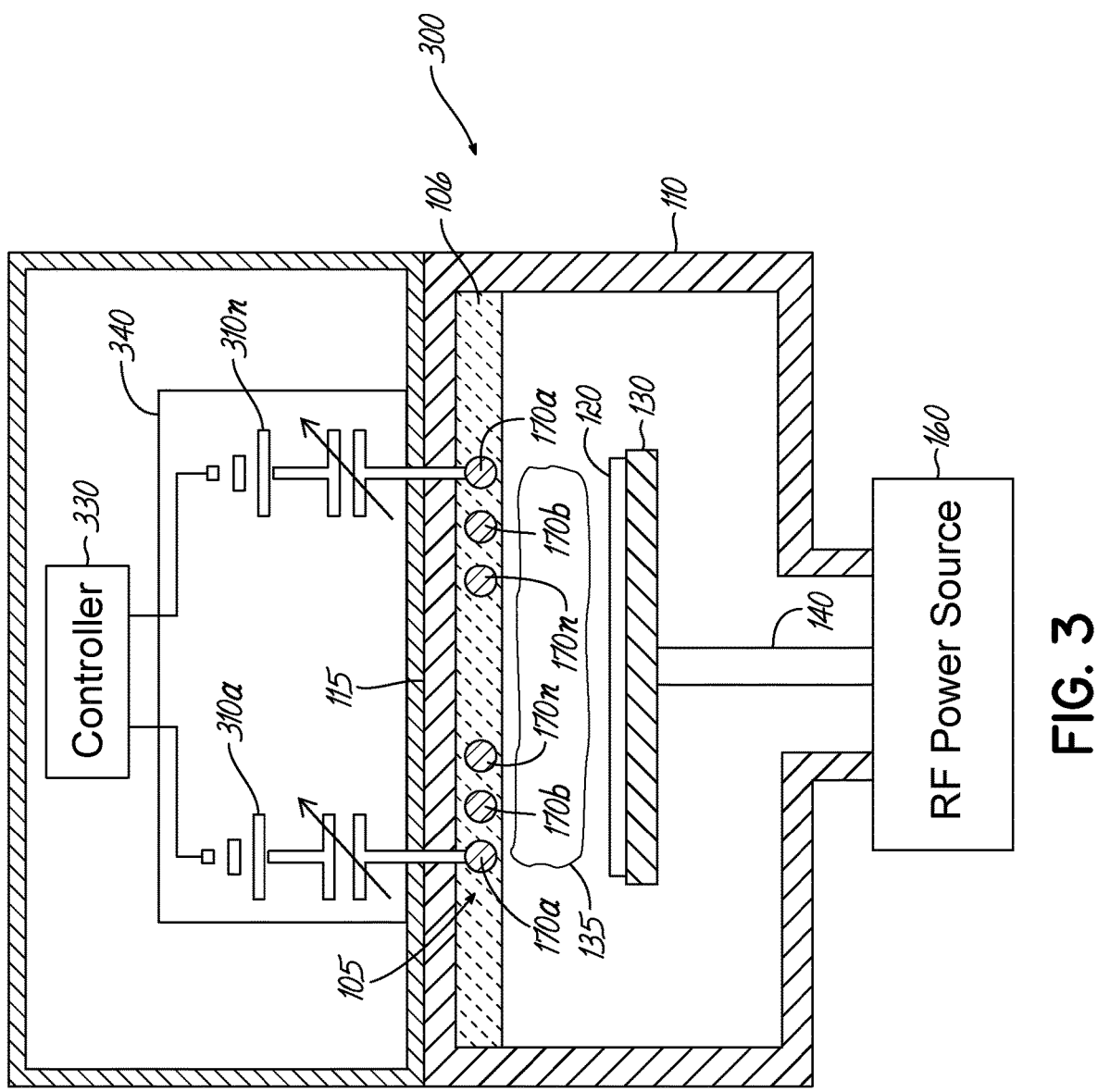
FIG. 3 is a diagrammatic cross-sectional view of a processing system for VHF wave treatment of a substrate in accordance with an embodiment of the invention.

Referring to FIG. 3, in which like reference numerals are used to refer to like parts, a diagrammatic cross-sectional view of a processing system 300 for RF wave treatment of a substrate is shown. The processing system 300 shares many similar features with the processing systems 100 and 200; therefore, only the differences between the processing system 300 and the processing systems 100 and 200 are to be discussed in further detail. Each resonant substructure 170(a-n) has a respective capacitance 310(a-n). Rather than adjusting the frequency of the RF power generated by the RF power source 160 and/or adjusting the position of the resonant structure 105, the system is modified to adjust the respective capacitances 310(a-n) of resonant substructures 170(a-n) relative to ground to adjust the plasma density relative to different portions of the substrate 120. For example, as shown in FIG. 3, a controller 330 controls a capacitance adjustment unit 340 to adjust each respective capacitance 310(a-n), where a is equal to one and n is an integer equal to or greater than one, that corresponds to each resonant substructure 170(a-n) selected to resonate.

In an embodiment, each resonant substructure 170(a-n) may be coupled to a respective variable capacitor 310(a-n) so that the capacitance adjustment unit 340 may independently vary the capacitance of each resonant substructure 170(a-n) relative to ground. As noted above, the resonant structure 105 may electrically float relative to the grounded planar top surface 115 of the process chamber 110. The adjusting of the capacitance 310(a-n) by the capacitance adjustment unit 340 for each resonant substructure 170(a-n) relative to ground may also adjust the resonant frequency of each resonant substructure 170(a-n). Rather than adjusting the RF operating frequency to excite each resonant substructure 170(a-n) into resonation, the RF operating frequency may remain fixed. The capacitance 310a of the selected resonant substructure 170a that is to resonate may be adjusted to adjust the resonant frequency of the selected resonant substructure 170a to be at or near the fixed RF operating frequency of the plasma 135 so that the selected resonant substructure 170a then resonates.

The pre-determined process conditions may designate specific portions of the substrate 120 that may require an increase in plasma density at an energy level that is provided by specific resonant substructures 170(a-n) so that the substrate 120 may be uniformly treated with plasma 135. In assembling the processing system 300, the appropriate resonant substructures 170(a-n) may then have their positions fixed over the appropriate portion of the substrate 120. For example, the pre-determined process conditions may determine that the center portion of the substrate 120 requires an increase in plasma density at an energy level that may be provided by the resonant substructure 170n. The pre-determined process conditions may also determine that the edge portions of the substrate 120 require an increase in plasma density at an energy level that may be provided by the resonant substructure 170*a*. The resonant substructure 170*n* may then have its position fixed over the center portion of the substrate 120 and the resonant substructure 170*a* may then have its position fixed over the edge portions of the substrate 120. The RF power generated by the RF power source 160 may also be fixed at a power level to generate a fixed RF operating frequency that may stimulate the resonant substructures 170(*a-n*) into resonance based on the respective capacitance 310(*a-n*) adjusted by the controller 330.

The RF power source 160 generates RF power at a power level that ignites the plasma 135 with a fixed RF operating frequency that is not adjusted. The controller 330 may then determine based on the pre-determined process conditions which resonant substructure 170(*a-n*) should be triggered into resonance to increase the plasma density over a particular portion of the substrate 120 at the energy level associated with the corresponding resonant substructure 170(*a-n*). The controller 330 may then control the capacitance adjustment unit 340 to control the capacitance 310*a* of the selected resonant substructure 170*a* to adjust the resonant frequency of the resonant substructure 170*a* to be at or near the fixed RF operating frequency. The selected resonant substructure 170*a* may then resonate at the energy level associated with the selected resonant substructure 170*a* to increase the plasma density over the portion of the substrate 120 requiring an increase in plasma density at that energy level.

For example, the RF power source 160 generates RF power at a power level to ignite the plasma 135 with a fixed RF operating frequency of 60 MHz. The controller 330 may then determine that the edge portions of the substrate 120 require an increase in plasma density at an energy level that is associated with the resonant substructure 170*a* that is positioned over the edge portions of the substrate 120. The controller 330 may control the capacitance adjustment unit 340 to adjust the capacitance 310*a* of the resonant substructure 170*a* to adjust the resonant frequency of the resonant substructure 170*a* to be at or near 60 MHz. The resonant substructure 170*a* then resonates at the energy level associated with the resonant substructure 170*a* as the resonant substructure 170*a* engages the RF waves at 60 MHz triggering an increase in plasma density over the edge portions of the substrate 120.

As noted above, a time interval that each portion of the substrate 120 is exposed to an increase in plasma density may be determined based on pre-determined process conditions. The controller 330 may control the capacitance adjustment unit 340 to adjust the capacitance 310*a* of the selected resonant substructure 170*a* so that the resonant frequency of the selected resonant substructure 170*a* may be adjusted to be at or near the fixed RF operating frequency. The adjustment of the resonant frequency to be at or near the fixed RF operating frequency thus triggers the selected resonant substructure 170*a* to resonate over a first portion of the substrate 120 for the first time interval. After the first time interval has been completed, the controller 330 may then control the capacitance adjustment unit 340 to adjust the capacitance 310*a* of the resonant substructure 170*a* currently resonating. The adjustment of the capacitance 310*a* may adjust the resonant frequency of the currently resonating resonant substructure 170*a* to a frequency that is substantially different from the fixed RF operating frequency of the plasma 135. The adjustment of the resonant frequency to differ from the fixed RF operating frequency of the plasma 135 terminates the resonation of the resonant substructure 170*a*.

The controller 330 may then control the capacitance adjustment unit 340 to adjust the capacitance 310*n* of the resonant substructure 170*n* that is to resonate over a different portion of the substrate 120 for the second time interval. The capacitance adjustment unit 340 may adjust the capacitance 310*n* of the second resonant substructure 170*n* that is to resonate during the second time interval. The adjustment of the capacitance 310*n* may adjust the resonant frequency of the second resonant substructure 170*n* to be at or near the fixed RF operating frequency of the plasma 135 so that the second resonant substructure 170*n* resonates over a second portion of the substrate 120 for the second time interval. The controller 330 may then transition the resonation of the resonant substructures 170*n* back and forth by controlling the capacitance adjustment unit 340 to adjust the appropriate capacitance 310*a* and 310*n* for each until the substrate 120 is processed.

As noted above, the resonant substructures 170*a* and 170*n* may resonate simultaneously at different energy levels when the resonant substructures 170*a* and 170*n* engage RF waves with an RF operating frequency that is between the first resonant frequency of the resonant substructure 170*a* and the second resonant frequency of the resonant substructure 170*n*. Each portion of the substrate 120 may then receive the appropriate increase in the plasma density simultaneously when the resonant substructures 170*a* and 170*n* resonate simultaneously at the different energy levels.

Applying this concept to the embodiment disclosed in FIG. 3, the controller 330 may control the capacitance adjustment unit 340 to adjust the capacitance 310*a* and 310*n* of the resonant substructures 170*a* and 170*n* so that the resonant frequencies for the resonant substructures 170*a* and 170*n* are also adjusted. The resonant frequencies may be adjusted so that the fixed RF operating frequency of the plasma 135 is between the adjusted resonant frequencies of the resonant substructures 170*a* and 170*n*. The adjustment of the resonant frequencies of the resonant substructures 170*a* and 170*n* so that the fixed RF operating frequency of the plasma 135 is between each may trigger both resonant substructures 170*a* and 170*n* to resonate simultaneously. Thus, the different portions of the substrate 120 may receive the simultaneous increases in the plasma density at the energy levels that correspond to the resonant substructures 170*a* and 170*n*.

Figure 4:
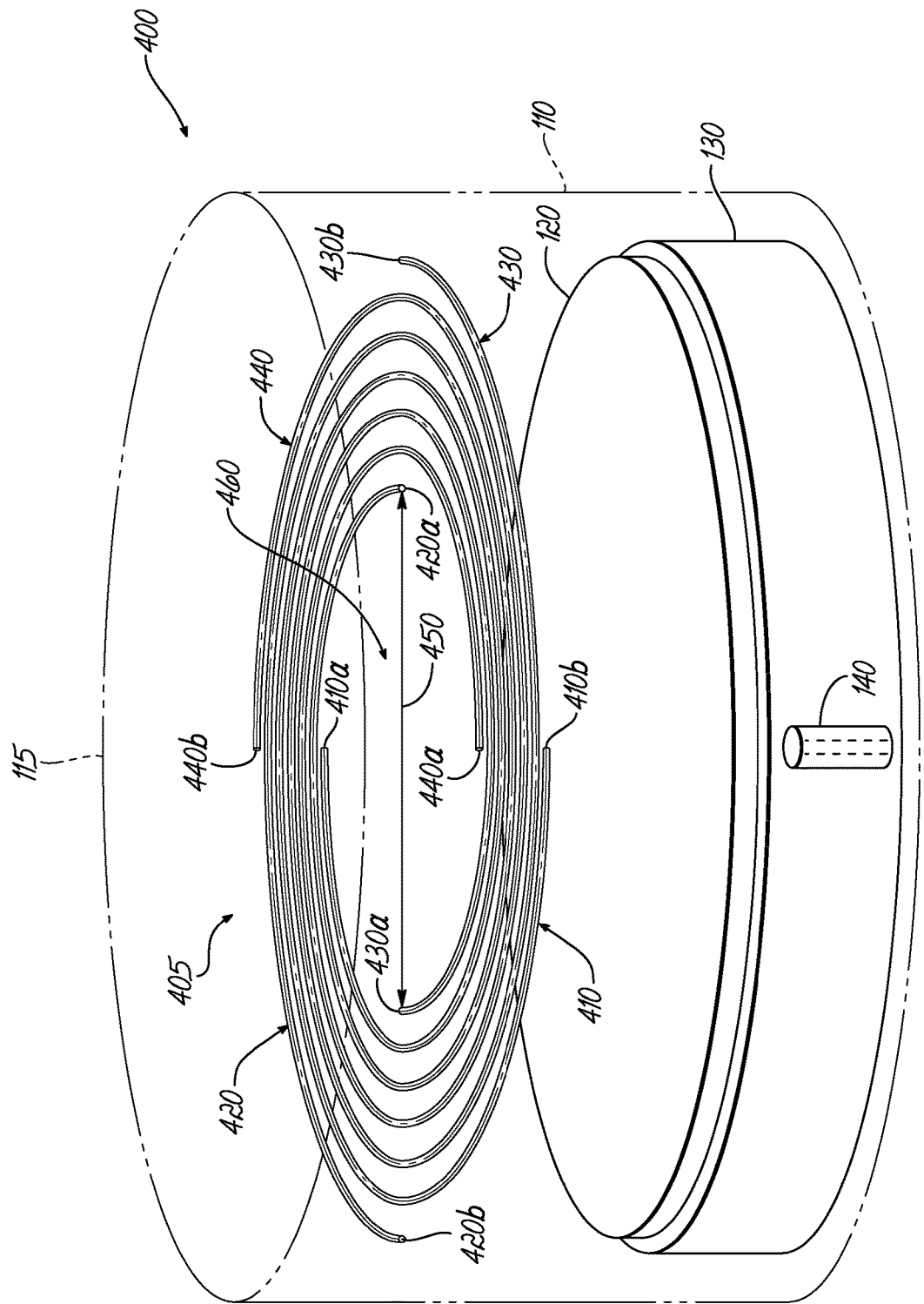
FIG. 4 is a diagrammatic perspective view of one possible configuration of a processing system for VHF wave treatment of a substrate in accordance with an embodiment of the invention.

Referring now to FIG. 4, in which like reference numerals are used to refer to like parts, a diagrammatic perspective view of a processing system 400 is shown to illustrate one possible configuration of a processing system for VHF wave treatment of a substrate. The processing system 400 shares many similar features with the processing system 100, the processing system 200, and the processing system 300; therefore, only the differences between the processing system 400 and the processing systems 100, 200, and 300 are to be discussed in further detail.

The process chamber 110 includes a resonant structure 405 with a plurality of resonant substructures 410, 420, 430 and 440. In this example, while the resonant structure 405 includes four resonant substructures, the resonant structure 405 may include any quantity of resonant substructures that are capable of resonating at a resonant frequency to increase the plasma density received by the substrate 120 that will be apparent to those skilled in the relevant art(s) without departing from the scope of the present invention. Each resonant substructure 410, 420, 430 and 440 is an electrically floating conductive rod where each floats relative to the grounded planar top surface 115 of the process chamber 110. Each resonant substructure 410, 420, 430 and 440 may be embedded or encased within material 106 forming an insulating plate-shaped member such as quartz or a ceramic such as Alumina or Yttrium oxide, as shown in FIG. 3.

The resonant structure 405 may include a spiral-shaped resonant substructure configuration where the resonant substructures 410, 420, 430 and 440 are interleaved with each other in a plane forming a ring-like resonant structure 405. The resonant substructures 410, 420, 430 and 440 may also be interleaved so at least one of the resonant substructures 410, 420, 430 and 440 are non-planar with at least one other resonant substructure 410, 420, 430 and 440. Each resonant substructure 410, 420, 430 and 440 includes a first end 410a, 420a, 430a and 440a positioned on an inner radial location of the substrate 120 and a second end 410b, 420b, 430b, and 440b positioned on an outer radial location of the substrate 120. The outer radial locations of the substrate 120 are positioned radially outward from the inner radial locations of the substrate 120. For example, resonant substructure 410 includes a first end 410a positioned on an inner radial location of the substrate 120 and a second end 410b positioned on an outer radial location of the substrate 120.

Each resonant substructure 410, 420, 430 and 440 may be interleaved with each other so that a portion of each resonant substructure 410, 420, 430 and 440 overlaps with portions of each other resonant substructure 410, 420, 430 and 440. For example, the resonant structure 405 collectively completes a 360 degree circular structure that encompasses at least a portion of the substrate 120. The first end 410a of the resonant substructure 410 is positioned at 0 degrees and the second end 410b of the resonant substructure 410 is positioned at 180 degrees while the first end 420a of the resonant substructure 420 is positioned at 90 degrees and the second end 420b of the resonant substructure 420 is positioned at 270 degrees and so on. Thus, each resonant substructure 410, 420, 430 and 440 may be interleaved so that portions of each resonant substructure 410, 420, 430, and 440 overlap with each other.

In an embodiment, the controller (not shown) may control the positioning of the resonant substructures 410, 420, 430 and 440 that form the ring-like resonant structure 405 shown in FIG. 4 so that different portions of the substrate 120 may be exposed to increased plasma density that results from the resonating resonant substructures 410, 420, 430 and 440. As shown in FIG. 4, a distance 450 exists in the center of the ring-like resonant structure 405 from the first end 430a of the resonant substructure 430 to the first end 420a of the resonant substructure 420. The controller (not shown) extends the distance 450 to a maximum length when the ring-like resonant structure 405 is over the edge portions of the substrate 120 so that the edge portions receive an increase in plasma density as compared to the center portion of the substrate 120. The circumference of the inner circle 460 where no portion of the ring-like resonant structure 405 is over the center portion of the substrate 120 is also at a maximum when the distance 450 is extended to a maximum length.

The controller may then constrict the ring-like resonant structure 405 to increase the plasma density received by the center portion of the substrate 120 as compared to the edge portions of the substrate 120. In constricting the ring-like resonant structure 405, the controller may reduce the distance 450 to a minimal distance where the circumference of the inner circle 460 is also at a minimum. The ring-like resonant structure 405 may then be concentrated over the center portion of the substrate 120 rather than the edge portions of the substrate 120 so that the center portion of the substrate 120 receives the increase in plasma density from the resonating resonant substructures 410, 420, 430 and 440.

Figure 6:
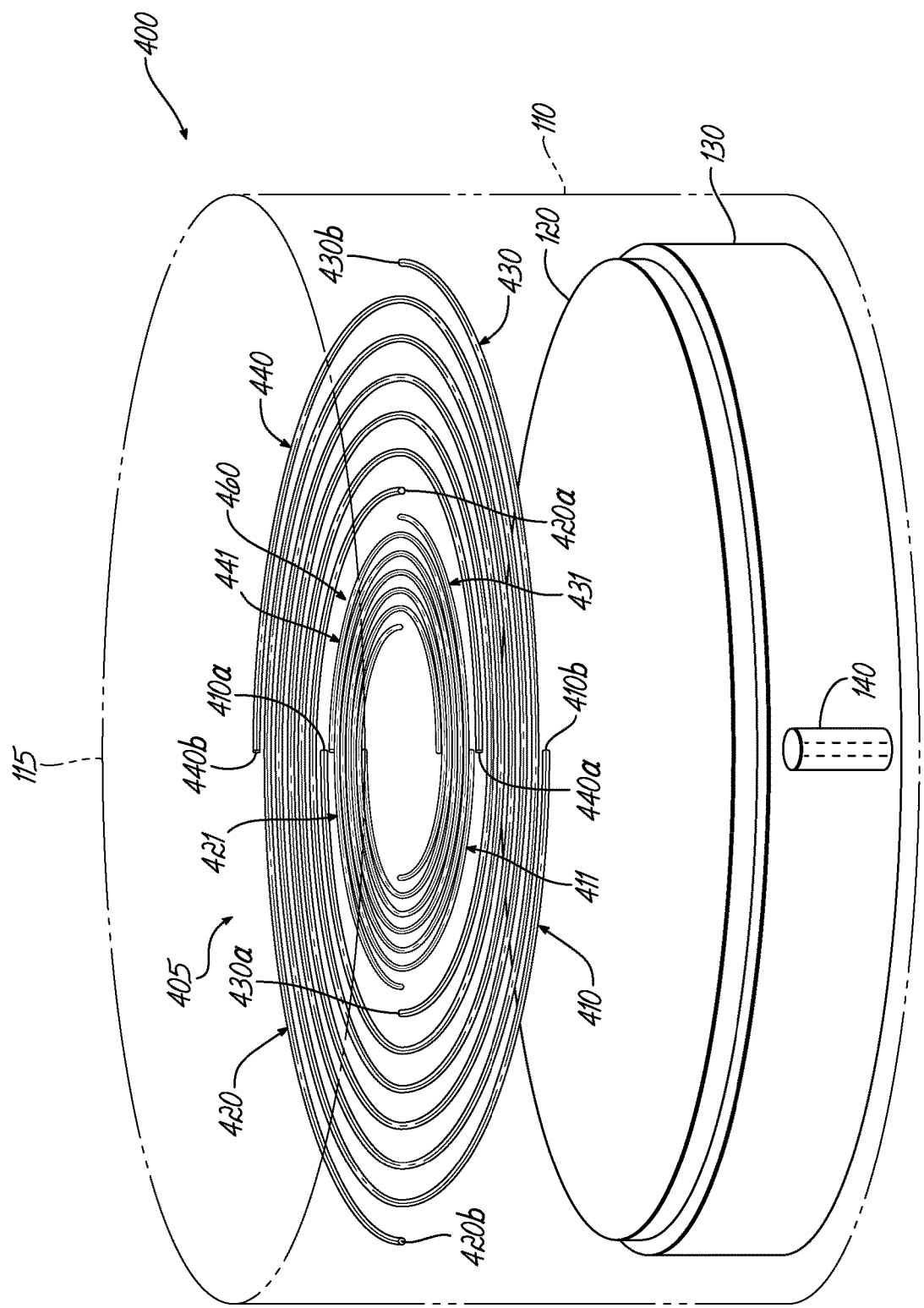
FIG. 6 is a diagrammatic perspective view of one possible configuration of a processing system for VHF wave treatment of a substrate in accordance with an embodiment of the invention.

In an embodiment, the ring-like resonant structure 405 may include a first plurality of resonant substructures that are interleaved with each other so that a portion of each resonant substructure overlaps with portions of each other resonant substructures. The first plurality of substructures may be further interleaved so that each resonant substructure includes a first end positioned on an inner radial location of the substrate 120 and a second end positioned on an outer radial location of the substrate 120. For example, the resonant substructures 410, 420, 430 and 440 as shown in FIG. 4 depict a first plurality of resonant substructures. The ring-like resonant structure 405 may also include a second plurality of resonant substructures The second plurality of resonant substructures 411, 421, 431, 441 may be interleaved with each other similar to the resonant substructures 410, 420, 430 and 440. However, the second plurality of resonant substructures may be positioned in the inner circle 460 that is inside the resonant substructures 410, 420, 430 and 440 as shown in FIG. 6. The controller may then control the resonant substructures 410, 420, 430 and 440 independently from the second plurality of resonant substructures.

The resonant substructures 410, 420, 430 and 440 may each have lengths that range from approximately a quarter wavelength ($\lambda/4$) to approximately three-quarters wavelength ($3\lambda/4$) where is the wavelength of the RF operating frequency. In another embodiment, the resonant substructures 410, 420, 430 and 440 may each have lengths that are approximately an integer number of half wavelengths ($\lambda/2$).

Figure 5:
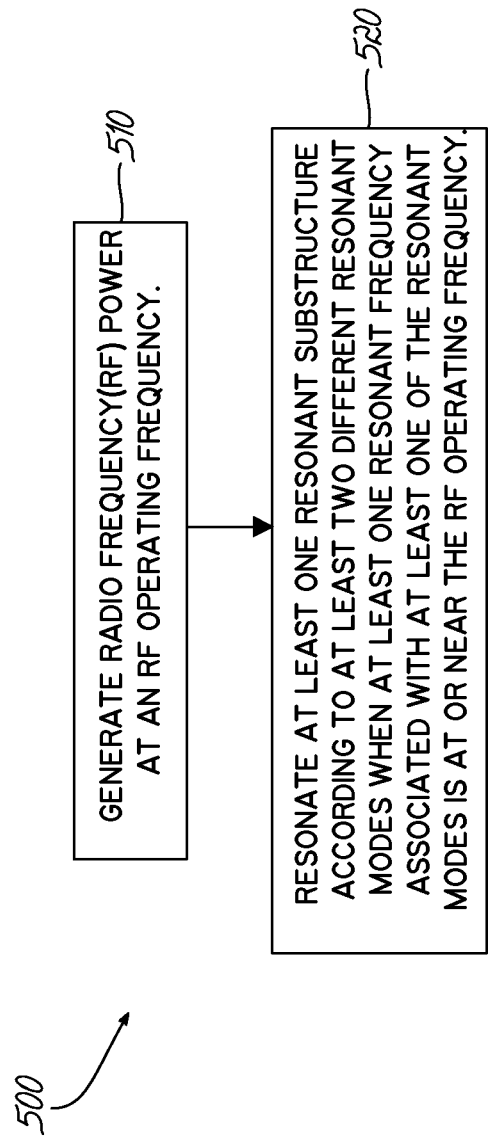
FIG. 5 is a flowchart of exemplary operational steps of a processing system according to an exemplary embodiment of the present invention.

FIG. 5 is a flowchart of exemplary operational steps of a processing system according to an exemplary embodiment of the present invention. The present invention is not limited to this operational description. Rather, it will be apparent to persons skilled in the relevant art(s) from the teaching herein that other operational control flows are within the scope and spirit of the present invention. The following discussion describes the steps in FIG. 5.

At step 510, the operational control flow generates RF power at an RF operating frequency. For example, the operation control flow provides a RF power source 160 that generates RF power at an RF operating frequency. The RF power ignites plasma 135 that includes EM waves that propagate at the RF operating frequency.

At step 520, the operational control flow resonates at least one resonant substructure according to at least two different resonant modes when at least one resonant frequency associated with at least one of the resonant modes is at or near the RF operating frequency. For example, at least one resonant substructure 170(a-n) resonates according to a first resonant mode and a second resonant mode. The at least one resonant substructure 170(a-n) resonates at the first resonant mode and/or the second resonant mode when a first resonant frequency associated with the first resonant mode and/or a second resonant frequency associated with the second resonant mode are at or near the RF operating frequency of the EM waves included in the plasma 135.

It is to be appreciated that the Detailed Description section, and not the Abstract section, is intended to be used to interpret the claims. The Abstract section can set forth one or more, but not all exemplary embodiments, of the present invention, and thus, is not intended to limit the present invention and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. An apparatus for plasma processing of a substrate, comprising:
   a processing chamber defining a processing space and having a substrate holder therein for holding a substrate;
   an RF power system coupled to the substrate holder within the processing chamber via a transmission line, the RF power system configured to provide RF power via the transmission line and substrate holder at an RF operating frequency and create a plasma proximate to the substrate holder and above the substrate;
   a resonant structure arranged within the processing chamber and positioned above the substrate holder, the resonant structure isolated from the RF power system, transmission line and the substrate holder wherein the resonant structure is not directly excited by any RF power generated by the RF power system of the apparatus, the resonant structure including a plurality of resonant substructures comprising electrically floating conductive rods configured and dimensioned to resonate according to at least two different resonant frequencies;
   the resonant frequencies being at or near the RF operating frequency of the RF power coupled to the plasma for affecting the density of the plasma;
   a controller including a processor configured to control the RF power system to adjust the RF operating frequency to be at or above a first resonant frequency for at least one of the resonant substructures to cause that respective resonant substructure to resonate for a first time duration and further to adjust the RF operating frequency to be at or below a second resonant frequency for another one of the resonant substructures to cause a different resonant substructure to resonate for a second time duration.

2. The apparatus of claim 1, wherein each of the electrically floating conductive rods of the plurality of resonant substructures has a length that ranges from approximately a quarter wavelength ($\lambda/4$) to approximately three quarters wavelength ($3\lambda/4$), wherein $\lambda$ is a free-space wavelength corresponding to the RF operating frequency.

3. The apparatus of claim 2, wherein the electrically floating conductive rod is embedded or encased within an insulating plate-shaped member.

4. The apparatus of claim 1, wherein each of the electrically floating conductive rods of the plurality of resonant substructures has a length that is approximately an integer number of half wavelengths ($\lambda/2$), wherein $\lambda$ is a free-space wavelength corresponding to the RF operating frequency.

5. The apparatus of claim 1, wherein the plurality of resonant substructures comprises:
   a plurality of spiral-shaped conductive rods insulated from one another and interleaved in a plane to collectively form a ring-like structure, each spiral-shaped conductive rod has an inner radial end positioned overlying an inner radial location on the substrate and an outer radial end positioned overlying an outer radial location on the substrate that is radially outward from the inner radial location.

6. The apparatus of claim 5, wherein the ring-like structure is embedded or encased within an insulating plate-shaped member.

7. The apparatus of claim 5, wherein the plurality of spiral-shaped conductive rods includes a quantity of n spiral-shaped conductive rods, wherein the outer radial end of each spiral-shaped conductive rod is spaced at azimuthal intervals equal to about 2n radians divided by n.

8. The apparatus of claim 5, wherein the ring-like structure is positioned proximate a peripheral edge of the substrate that is at the outer radial location, wherein the peripheral edge is positioned opposite the at least one resonant substructure included in the ring-like structure that is configured to resonate.

9. The apparatus of claim 5, wherein the plurality of spiral-shaped conductive rods further comprise:
   a first plurality of spiral-shaped conductive rods insulated from one another and interleaved in the plane to collectively form a first ring-like structure that opposes the substrate; and
   a second plurality of spiral-shaped conductive rods insulated from one another and interleaved in the plane to collectively form a second ring-like structure that opposes the substrate,
   wherein each of the spiral-shaped conductive rods have the inner radial end positioned overlying the inner radial location on the substrate and the outer radial end positioned overlying the outer radial location on the substrate radially outward from the inner radial location.

10. The apparatus of claim 1, wherein the substrate holder is arranged within the plasma processing chamber such that the plurality of resonant substructures oppose the substrate.

11. The apparatus of claim 1, wherein at least one of the plurality of resonant substructures is arranged opposite a peripheral region of the substrate holder.

12. The apparatus of claim 1, wherein the RF power system is configured to generate the RF power including a first signal component characterized by a first RF operating frequency at or near the first resonant frequency and a second signal component characterized by a second RF operating frequency at or near the second resonant frequency.

13. The apparatus of claim 12, wherein said RF power system comprises:
   a first RF generator that is configured to output the RF power at the first RF operating frequency; and
   a second RF generator that is configured to output the RF power at the second RF operating frequency.

14. The apparatus of claim 12, wherein said RF power system comprises:
   a single RF signal generator that is configured to generate the RF power including the first signal component characterized by the first RF operating frequency and the second signal component characterized by the second RF operating frequency; and
   an amplifier coupled to the single RF signal generator and configured to amplify the first signal component and the second signal component.

15. The apparatus of claim 12, wherein the controller is further configured to adjust a first power level associated with the first signal component and a second power level associated with the second signal component to mix the first RF operating frequency of the first signal component with the second RF operating frequency of the second signal component to generate a mixed RF signal that is characterized by a mixed RF operating frequency, wherein the mixed RF operating frequency is between the first RF operating frequency and the second RF operating frequency.

16. The apparatus of claim 15, wherein the RF power system is configured to generate the RF power at a fixed RF operating frequency.

17. The apparatus of claim 16, further comprising:
a capacitance adjustment unit configured to adjust a capacitance of the at least one resonant substructure relative to ground to shift the at least one resonant frequency to be at or near the RF operating frequency to cause the at least one resonant substructure to resonate.

* * * * *

UNITED STATES PATENT AND TRADEMARK OFFICE
CERTIFICATE OF CORRECTION

PATENT NO. : 10,861,679 B2
APPLICATION NO. : 14/838839
DATED : December 8, 2020
INVENTOR(S) : Barton Lane It is certified that error appears in the above-identified patent and that said Letters Patent is hereby corrected as shown below:

In the Specification

Column 18, Line 17, "plurality of resonant substructures The" should be --plurality of resonant substructures. The--.

Column 18, Line 29, "length (3λ/4) where is the wavelength" should be --length (3λ/4) where λ is the wavelength--.

In the Claims

Column 20, Line 11, Claim 7, "intervals equal to about 2n radians divided by n." should be --intervals equal to about 2π radians divided by n.--.

Signed and Sealed this
Twenty-eighth Day of December, 2021

Drew Hirshfeld
*Performing the Functions and Duties of the
Under Secretary of Commerce for Intellectual Property and
Director of the United States Patent and Trademark Office*